(12) United States Patent
Lee et al.

(10) Patent No.: US 7,867,849 B2
(45) Date of Patent: Jan. 11, 2011

(54) METHOD OF MANUFACTURING A NON-VOLATILE SEMICONDUCTOR DEVICE

(75) Inventors: Choong-Ho Lee, Seongnam-si (KR); Jai-Hyuk Song, Seoul (KR); Dong-Uk Choi, Seongnam-si (KR); Suk-Kang Sung, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 12/222,074

(22) Filed: Aug. 1, 2008

(65) Prior Publication Data

US 2009/0035906 A1     Feb. 5, 2009

(30) Foreign Application Priority Data

Aug. 2, 2007     (KR) .................... 10-2007-0077633

(51) Int. Cl.
*H01L 21/336* (2006.01)
(52) U.S. Cl. .................. 438/264; 438/593; 438/594; 257/E21.423; 257/E29.309
(58) Field of Classification Search ................ 438/257, 438/264, 587, 591, 593, 594; 257/324, E21.423, 257/E29.309
See application file for complete search history.

(56) References Cited

U.S. PATENT DOCUMENTS 6,521,977 B1     2/2003   Burnham et al.
6,677,213 B1 *   1/2004   Ramkumar et al. ......... 438/308
6,774,462 B2 *   8/2004   Tanaka et al. ............... 257/639
6,815,805 B2 * 11/2004   Weimer ...................... 257/629
6,913,969 B2 *   7/2005   Yoo ........................... 438/248
6,921,937 B2 *   7/2005   Weimer ...................... 257/319
2002/0102777 A1 * 8/2002  Sakaguchi et al. .......... 438/149

FOREIGN PATENT DOCUMENTS

JP     2000-223674     8/2000
KR     10-0667920      1/2007

* cited by examiner

*Primary Examiner*—Khiem D Nguyen
(74) *Attorney, Agent, or Firm*—Harness, Dickey & Pierce, PLC

(57) ABSTRACT

Example embodiments relate to methods of fabricating a non-volatile memory device. According to example embodiments, a method of fabricating a non-volatile memory device may include forming at least one gate structure on an upper face of a substrate. The at least one gate structure may include a tunnel insulation layer pattern, a charge storing layer pattern, a dielectric layer pattern and a control gate. According to example embodiments, a method of fabricating a non-volatile memory device may also include forming a silicon nitride layer on the upper face of the substrate to cover the at least one gate structure, forming an insulating interlayer on the silicon nitride layer on the upper face of the substrate, and providing an annealing gas toward the upper face of the substrate and a lower face of the substrate to cure defects of the tunnel insulation layer pattern.

17 Claims, 9 Drawing Sheets

METHOD OF MANUFACTURING A NON-VOLATILE SEMICONDUCTOR DEVICE

PRIORITY STATEMENT

This application claims priority under 35 U.S.C. §119 to Korean Patent Application No. 2007-77633, filed on Aug. 2, 2007, in the Korean Intellectual Property Office (KIPO), the entire contents of which are herein incorporated by reference.

BACKGROUND

1. Field

Example embodiments relate to methods of fabricating a non-volatile memory device. More particularly, example embodiments relate methods of fabricating a flash memory device.

2. Description of the Related Art

A non-volatile memory device may maintain data stored therein even when the power supply is turned off. A flash memory device is a non-volatile memory device in which data may be electrically input or output. Flash memory devices may include a memory cell with a stacked structure. The stacked structure may include a tunnel insulation layer pattern, a charge storing layer pattern, a dielectric layer pattern, and a control gate sequentially stacked on a substrate.

In flash memory devices, data may be input or output by applying voltages to the control gate and the substrate to input electrons into the charge storing layer pattern or output electrons from the charge storing layer pattern. The electrons may be input into or output from the charge storing layer pattern through a tunnel insulation layer pattern that may be between the charge storing layer pattern and the substrate.

Repeated operation of a flash memory device may cause chemical bonds in the tunnel insulation layer pattern to break due to stresses generated therein. Accordingly, dangling bonds may be formed in the tunnel insulation layer pattern. Because electrons may be trapped in the dangling bonds, the threshold voltages of the memory cell may change. As a result, the flash memory device may have a deteriorated reliability.

In order to enhance the reliability, endurance, and/or data retention of a flash memory device, defects in the tunnel insulation layer may be cured. Thus, dangling bonds that may form in an interface between the tunnel insulation layer pattern and the substrate or in an interface between the tunnel insulation layer pattern and the charge storing layer pattern may be removed to reduce or prevent the trapping of electrons in the interfaces.

In order to remove the dangling bonds in the above interfaces, an annealing process using hydrogen may be performed on the flash memory device. However, hydrogen atoms may not penetrate certain layers of the flash memory device that cover the tunnel insulation layer pattern, e.g., a silicon nitride layer. Because the hydrogen atoms may be prevented or inhibited from reaching the tunnel insulation pattern, the annealing process may not remove the dangling bonds. Accordingly, the annealing process may not improve the characteristics of the tunnel insulation pattern.

SUMMARY

Example embodiments provide methods of fabricating a non-volatile memory device having improved reliability According to example embodiments, a method of fabricating a non-volatile memory device may include forming at least one gate structure on an upper face of a substrate. The at least one gate structure may include a tunnel insulation layer pattern, a charge storing layer pattern, a dielectric layer pattern and a control gate. According to example embodiments, a method of fabricating a non-volatile memory device may also include forming a silicon nitride layer on the upper face of the substrate to cover the at least one gate structure, forming an insulating interlayer on the silicon nitride layer on the upper face of the substrate, and providing an annealing gas toward the upper face of the substrate and a lower face of the substrate to cure defects of the tunnel insulation layer pattern.

BRIEF DESCRIPTION OF THE DRAWINGS

Example embodiments will be more clearly understood from the following detailed description taken in conjunction with the accompanying drawings.

FIGS. 1 to 7 are cross-sectional views illustrating a method of fabricating a non-volatile memory device in accordance with example embodiments; and FIGS. 8 and 9 are cross-sectional views illustrating a method of fabricating a non-volatile memory device in accordance with example embodiments.

DETAILED DESCRIPTION OF EXAMPLE EMBODIMENTS

Figure 1:
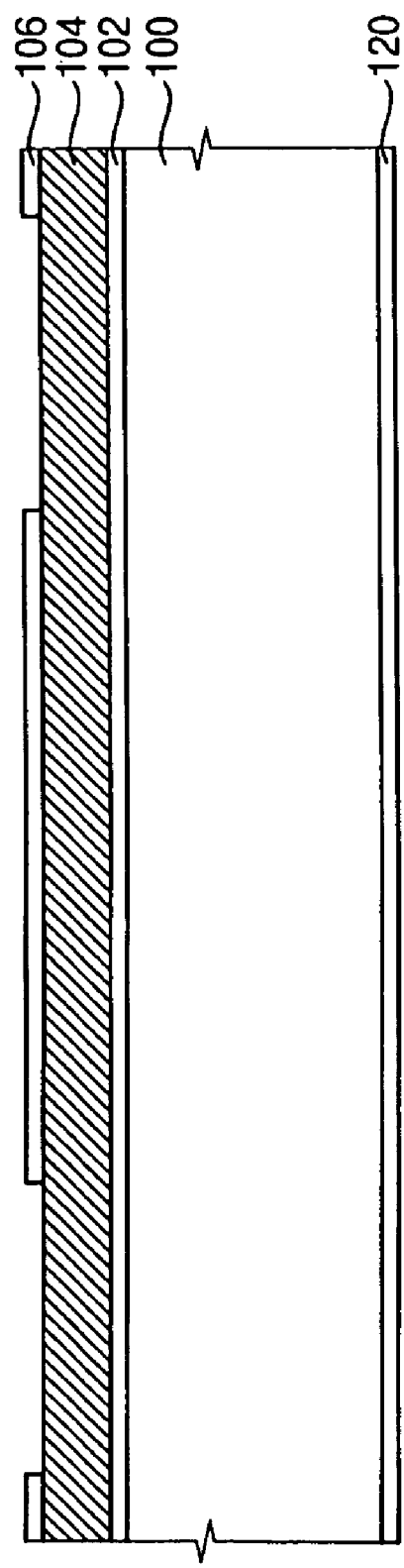
FIGS. 1 to 9 represent non-limiting, example embodiments as described herein.

Example embodiments are described more fully hereinafter with reference to the accompanying drawings, in which example embodiments are shown. Example embodiments may, however, be embodied in many different forms and should not be construed as limited to the example embodiments set forth herein. Rather, example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, example embodiments will be explained in detail with reference to the accompanying drawings.

FIGS. 1 to 7 are cross-sectional views illustrating a method of manufacturing a non-volatile memory device in accordance with example embodiments. Referring to FIG. 1, a substrate 100 including a semiconductor material, e.g., silicon, may be provided. An etching mask (not shown) may be formed on the substrate 100, and an upper portion of the substrate 100 may be removed using the etching mask to form a trench (not shown). An insulation layer (not shown) may be formed on the substrate 100 to cover the trench, and an upper portion of the insulation layer may be removed by a planarization process to form an isolation layer (not shown). The isolation layer may define an active region and a field region in the substrate 100. The active and field regions may be formed parallel to each other, and each of the active and field regions may extend in a first direction. In FIG. 1, only the active region is shown.

A tunnel insulation layer 102 may be formed on the substrate 100 and may be formed by a thermal oxidation process. A charge storing layer (not shown) may be formed on the tunnel insulation layer 102. The charge storing layer may be formed by depositing polysilicon, a high-k metal oxide, silicon nitride, or a nanocrystalline material, on the tunnel insulation layer 102. These materials may be used alone or in a combination thereof. When the charge storing layer is formed using polysilicon, a floating gate type flash memory device may be manufactured. When the charge storing layer is formed using a high-k metal oxide, silicon nitride or a nanocrystalline material, a charge trapping type flash memory device may be manufactured. In example embodiments, the charge storing layer may be formed using polysilicon, a high-k metal oxide, a silicon nitride, a nanocrystalline material or any other material suitable for use as a charge storing layer.

The charge storing layer may be patterned to form a preliminary charge storing layer pattern 104. The preliminary charge storing layer pattern 104 may extend in the first direction. A dielectric layer 106 may be formed on the preliminary charge storing layer pattern 104. The dielectric layer 106 may be formed by an atomic layer deposition (ALD) process or a chemical vapor deposition (CVD) process using a high-k material. Examples of the high-k material may include, but are limited to, an aluminum oxide, hafnium oxide, and zirconium oxide. These materials may be used alone or in a combination thereof. When a metal oxide having a relatively high dielectric constant is used for the dielectric layer 106, the dielectric layer 106 may be formed to have a thickness of about 100 to about 500 Å. Alternatively, the dielectric layer 106 may be formed by sequentially depositing silicon oxide, silicon nitride and silicon oxide on the preliminary charge storing layer pattern 104.

A portion of the dielectric layer 106 may be removed by a photolithography process. For example, a portion of the dielectric layer 106 for a string selection transistor (SST) and a portion of the dielectric layer 106 for a ground selection transistor (GST) may be removed. Thus, the dielectric layer 106 may have an island shape.

Figure 2:
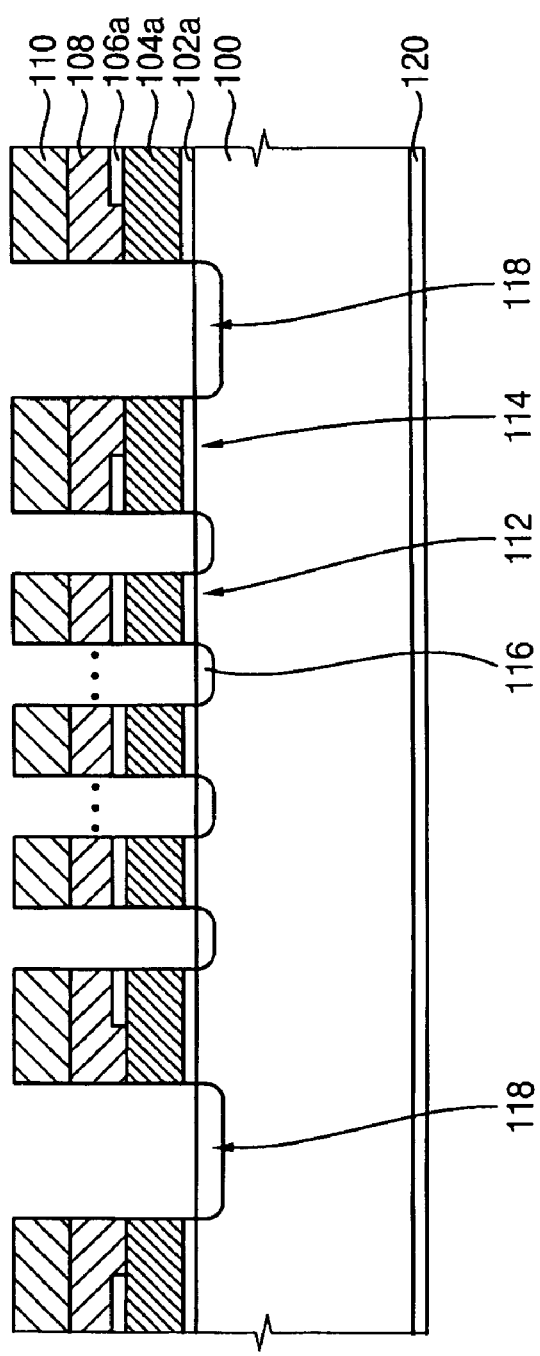

Referring to FIG. 2, a conductive layer may be formed on the dielectric layer 106 and the preliminary charge storing layer pattern 104. A hard mask 110 may be formed on the conductive layer. For example, the hard mask 110 may extend in a second direction substantially perpendicular to the first direction. The conductive layer, the dielectric layer 106, the preliminary charge storing layer pattern 104 and the tunnel insulation layer 102 may be partially etched using the hard mask 110 as an etching mask.

A first gate structure 112 and a second gate structure 114, each of which may include a tunnel insulation layer pattern 102a, a charge storing layer pattern 104a, a dielectric layer pattern 106a, a control gate 108, and the hard mask 110, may be formed. The second gate structure 114 may be included in the SST or the GST. In the second gate structure, the dielectric layer pattern 106a may not completely cover the charge storing layer pattern 104a. Thus, the charge storing layer pattern 104a and the control gate 108 of the second gate structure 114 may be connected to each other.

The second gate structure 114 may be formed on both sides of a group that may include several, e.g., thirty-two (32), first gate structures 112 disposed in the first direction. The second gate structure 114 may select a specific group among a plurality of groups disposed in the second direction. The first gate structures 112 may be formed to be distant from each other at a first distance, and the second gate structures 114 may be formed to be distant from each other at a second distance larger than the first distance. In example embodiments, the second distance may be twice the first distance, however, the second distance is not limited thereto.

Impurities may be implanted onto portions of the substrate 100 exposed by the first and second gate structures 112 and 114 to form a first impurity region 116 and a second impurity region 118. A plurality of the first impurity regions 116 may be formed on upper portions of the substrate 100 adjacent to the first gate structures 112 and on upper portions of the substrate 100 between the first and second gate structures 112 and 114. The second impurity region 118 may be formed on an upper portion of the substrate 100 between the second gate structures 114.

Thin films 120 may be formed on a lower face of the substrate 100 when the first and second gate structures 112 and 114 are formed on an upper face of the substrate 100. The thin films 120 may, for example, be a silicon oxide layer or a polysilicon layer on the lower face of the substrate 100 formed during the formation of the preliminary charge storing layer pattern 104 on the upper surface of the semiconductor substrate 100.

Figure 3:
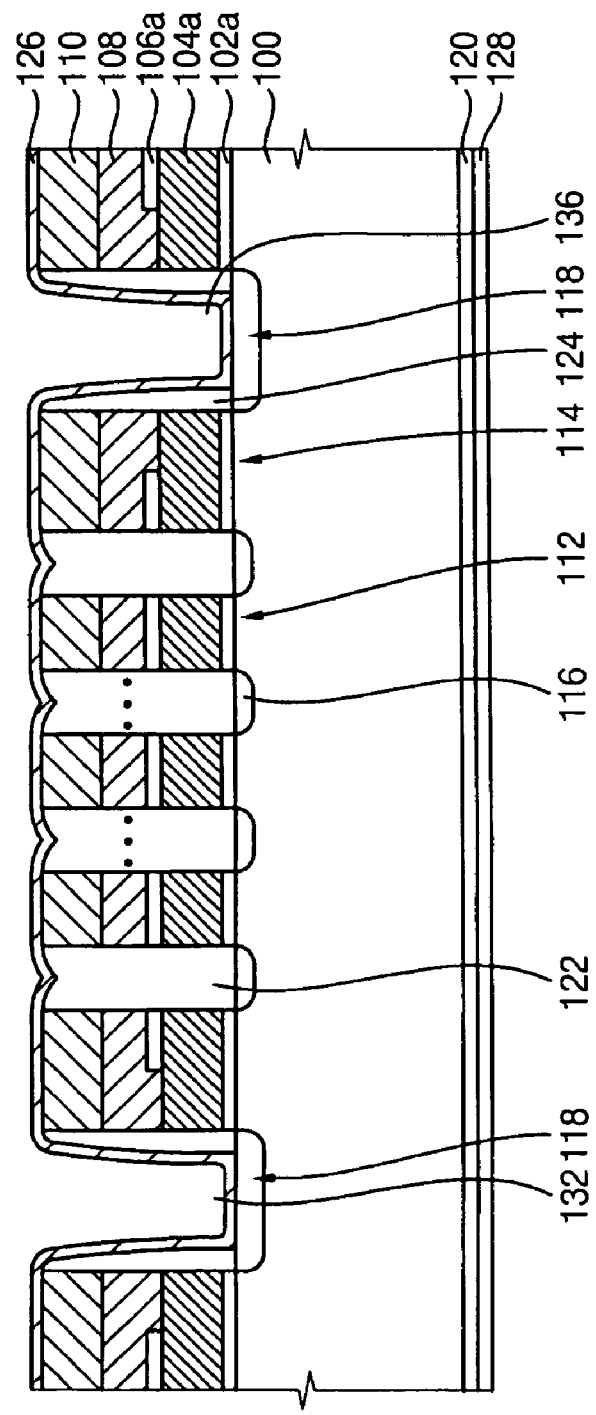

Referring to FIG. 3, an insulation layer may be formed on the substrate 100 to cover the first and second gate structures 112 and 114. The insulation layer may fill spaces between the first gate structures 112. However, because the second distance is larger than the first distance, the insulation layer may not fill the spaces between the second gate structures 114. The insulation layer may be formed using various materials, e.g., silicon oxide or silicon nitride.

The insulation layer may be partially etched by an anisotropic etching process to form an insulation layer pattern 122 between the first gate structures 112 and spacers 124 on sidewalls of the second gate structures 114. A silicon nitride layer 126 may be formed on the first and second gate structures 112 and 114, the insulation layer pattern 122, the spacers 124 and the exposed portions of the substrate 100. The silicon nitride layer 126 may serve as an etch stop layer while forming a contact in a successive process. The silicon nitride layer 126 may be formed by a low pressure chemical vapor deposition (LPCVD) process. When the LPCVD process is performed, another silicon nitride layer 128 may be formed on the thin films 120, which may be formed on the lower face of the substrate 100.

Figure 4:
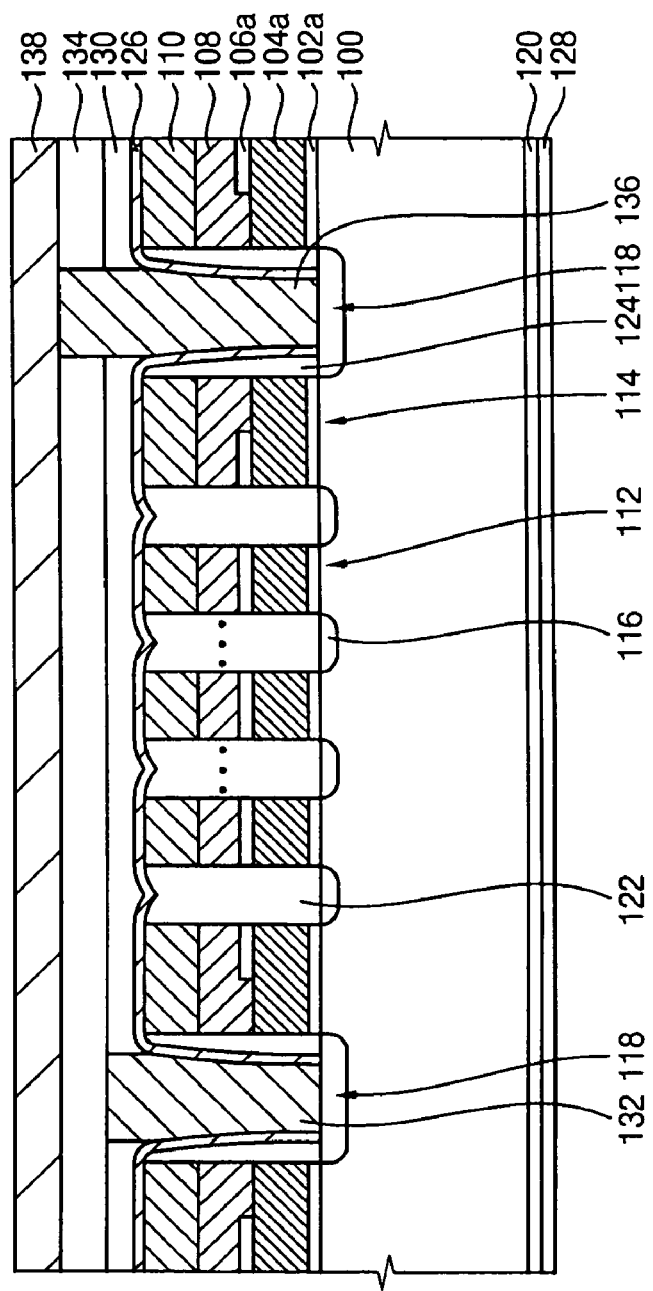

Referring to FIG. 4, a first insulating interlayer 130 may be formed on the silicon nitride layer 126. The first insulating interlayer 130 may be formed by a CVD process using silicon oxide. For example, the first insulating interlayer 130 may be formed using borophosphosilicate glass (BPSG). A portion of the first insulating interlayer 130 between the second gate structures 114, which may serve as a ground selection line (GSL), may be removed to expose a portion of the silicon nitride layer 126. The exposed portion of the silicon nitride layer 126 may be removed to form a trench partially exposing the second impurity region 118. The trench may be filled with a conductive material to form a common source line 132. The conductive material may include a doped polysilicon or a metal, e.g., tungsten.

A second insulating interlayer 134 may be formed on the first insulating interlayer 130. The second insulating interlayer 134 may be formed by a CVD process using silicon oxide. In example embodiments, the second insulating interlayer 134 may be formed by a high density plasma chemical vapor deposition (HDP-CVD) process.

Portions of the second insulating interlayer 134 and the first insulating interlayer 130 between the second gate structures 114, which may serve as a string selection line (SSL), may be removed to expose a portion of the silicon nitride layer 126. The exposed portion of the silicon nitride layer 126 may be removed to form a contact hole partially exposing the second impurity region 118.

The contact hole may be filled with a conductive material to form a contact 136. A conductive layer may be formed on the second insulating interlayer 134 and the contact 136, and the conductive layer may be patterned to form a bit line 138 on the second insulating interlayer 134 to be connected to the contact 136. In example embodiments, the bit line 138 may extend in the first direction.

Figure 5:
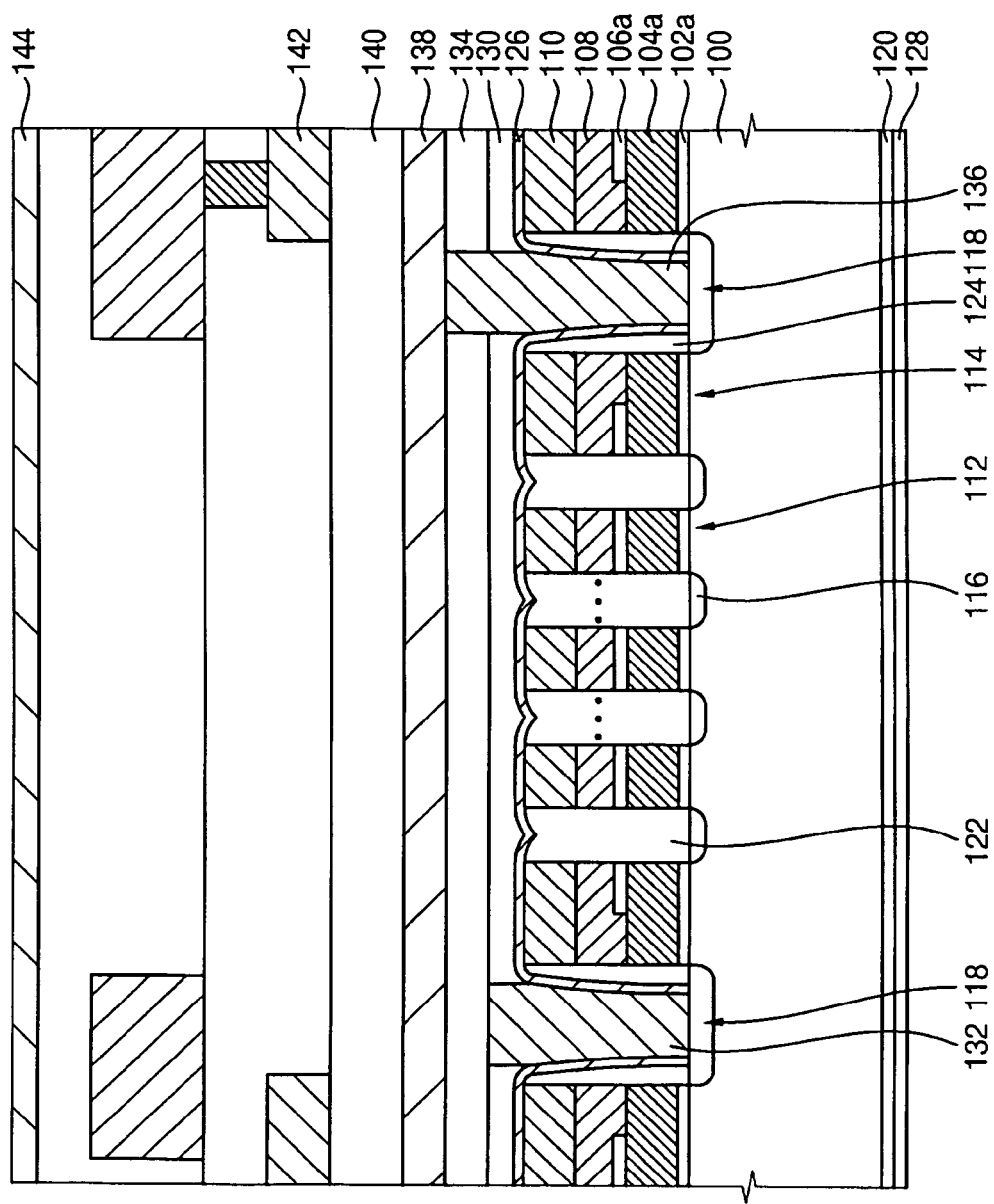

Referring to FIG. 5, a third insulating interlayer 140 may be formed on the second insulating interlayer 134 to cover the bit line 138. A metal wiring 142 may be formed on the third insulating interlayer 140. The third insulating interlayer 140 and the metal wiring 142 may have a multi-layered structure. A passivation layer 144 may be formed on an uppermost insulating interlayer to protect elements and wirings formed thereunder. The passivation layer 144 may have a multi-layered structure. For example, the passivation layer 144 may be formed to have a double-layered structure in which a silicon nitride layer and a polyimide layer are sequentially stacked.

Figure 6:
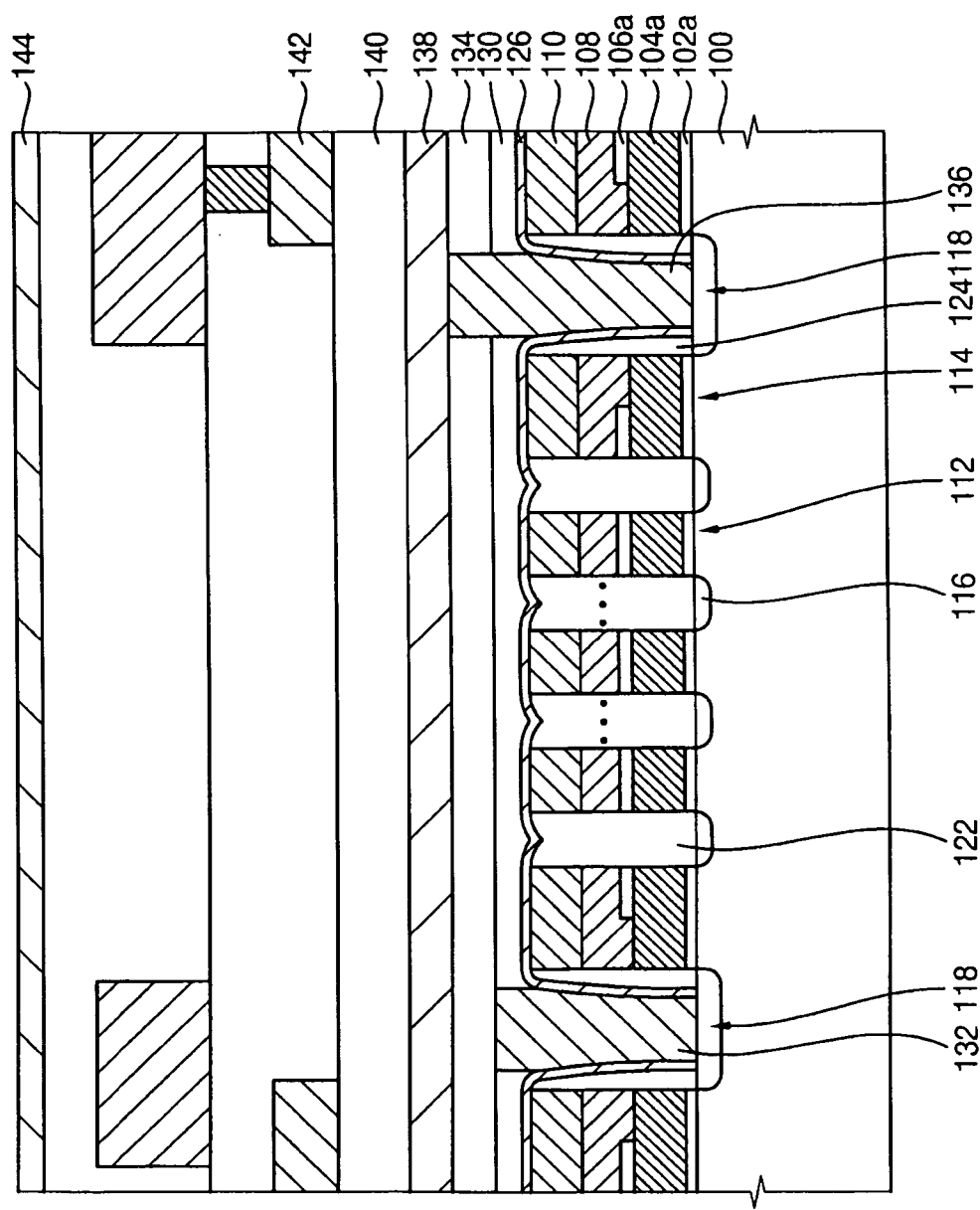

Referring to FIG. 6, the remaining layers on the lower face of the substrate 100, e.g. the silicon nitride layer 128 and the thin film 120, may be removed to expose the lower face of the substrate 100. The remaining layers, for example, may include a silicon nitride layer, a silicon oxide layer, and a polysilicon layer. The remaining layers may be removed by a dry etch process or a cleaning process.

Figure 7:
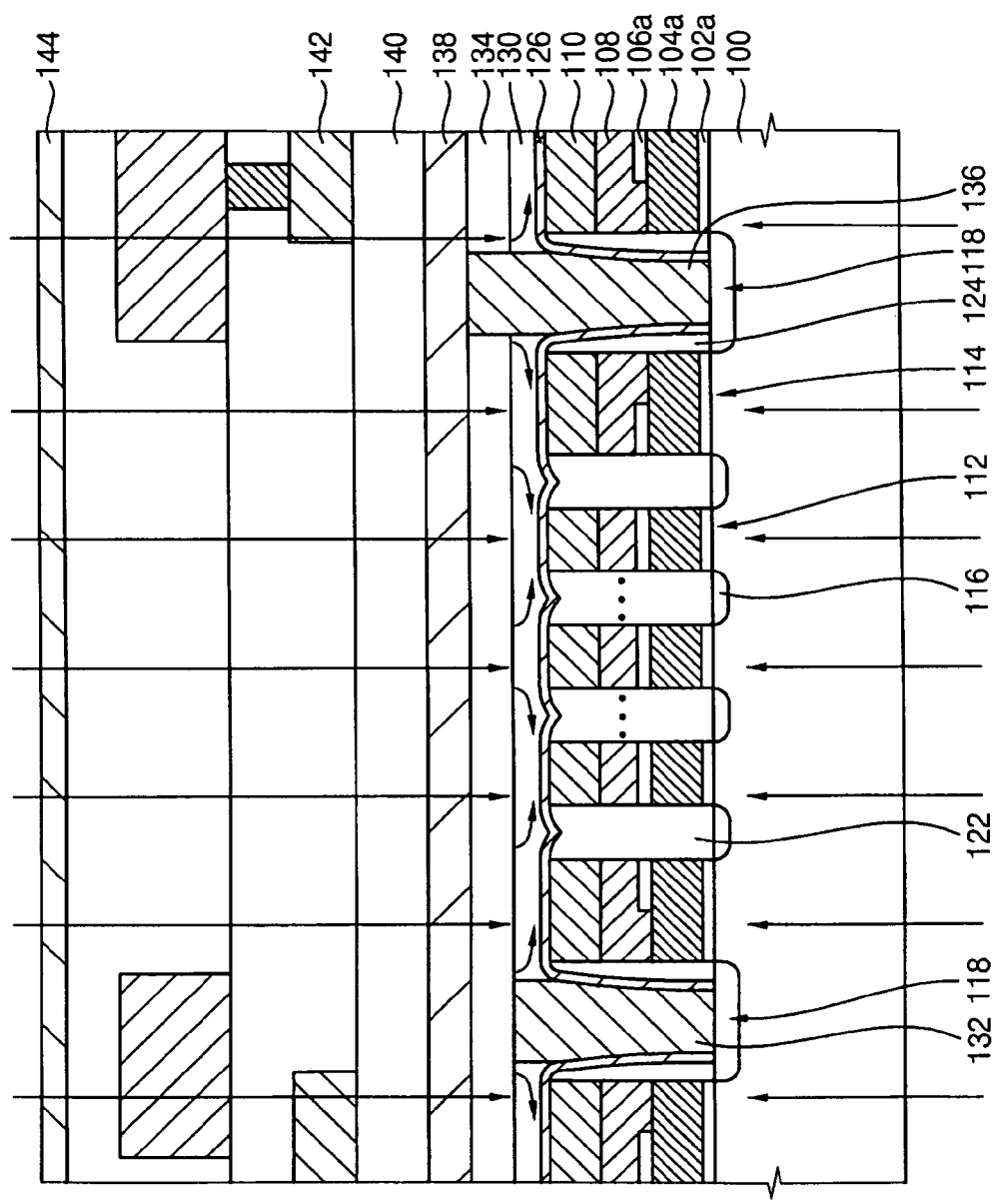

Referring to FIG. 7, the tunnel insulation layer pattern 102a may be cured by providing an annealing gas toward the upper and lower faces of the substrate 100. For example, the annealing gas may penetrate into the tunnel insulation layer pattern 102a and may combine with dangling bonds in the tunnel insulation layer pattern 102a, so that defects of the tunnel insulation layer pattern 102a may be cured. Thus, the annealing gas may be needed to penetrate into the tunnel insulation layer pattern 102a.

The annealing gas may include hydrogen gas, heavy hydrogen gas, and tritium gas, however, the annealing gases are not limited thereto. The annealing gas may be combined with silicon to form Si—H bonds. Among the various gases serving as the annealing gas, the heavy hydrogen gas may have the best effect of curing the tunnel insulation layer pattern 102a by being combined with the dangling bonds in the tunnel insulation layer 102a.

The annealing gas may be provided toward the upper face of the substrate 100 and/or the lower face of the substrate 100. The annealing gas, which may be provided to the upper face of the substrate 100, may not penetrate through the silicon nitride layer 126 serving as an etch stop layer, and thus may not reach the tunnel insulation layer pattern 102a. However, the annealing gas that may be provided onto the lower face of the substrate 100 may reach the tunnel insulation layer pattern 102a because the annealing gas may reach the tunnel insulation layer pattern 102a by penetrating through the silicon substrate 100 only. The remaining layers 128 and 120 may be removed from the lower face of the substrate 100 so that the annealing gas may more easily reach the tunnel insulation layer pattern 102a.

An annealing gas provided to the substrate 100 at a temperature of less than about 300° C. may not penetrate into the tunnel insulation layer pattern 102a. Accordingly, an annealing gas provided to the substrate 100 at a temperature of less than about 300° C. may not be combined with the dangling bonds in the tunnel insulation layer pattern 102a. However, an annealing gas provided to the substrate 100 at a temperature of more than 500° C. may damage various layers formed on the substrate 100 and may also cause the impurities of the impurity regions 116 and 118 to diffuse excessively. Thus, the annealing gas may be provided at a temperature of about 300 to about 500° C. In example embodiments, the annealing gas may be provided at a temperature of about 400 to about 450° C.

An annealing gas provided to the substrate 100 under a pressure of less than about 1 atm may not penetrate into the tunnel insulation layer pattern 102a. Additionally, the annealing gas may not be easily provided to the substrate 100 under a pressure of more than about 30 atm. Thus, the annealing gas may be provided under a pressure of about 1 to about 30 atm. In example embodiments, the annealing gas may be provided under a pressure of about 10 to about 20 atm. Due to the increased pressure, the annealing gas may be provided at a relatively low temperature of about 300 to about 500° C.

An annealing gas provided for less than about 30 minutes may not sufficiently cure the defects of the tunnel insulation layer pattern 102a. However, an annealing gas provided for more than about 90 minutes may thermally damage the various layers formed on the substrate 100. Thus, the annealing gas may be provided for about 30 to about 90 minutes.

As described above, the flash memory device may be manufactured by providing an annealing gas to the substrate 100 so that the annealing gas may penetrate into the tunnel insulation layer pattern 102a and the defects thereof may be cured. The flash memory device, according to example embodiments, may, therefore, have improved reliability, endurance, and/or data retention, because the tunnel insulation layer pattern 102a has improved electrical characteristics.

Figure 8:
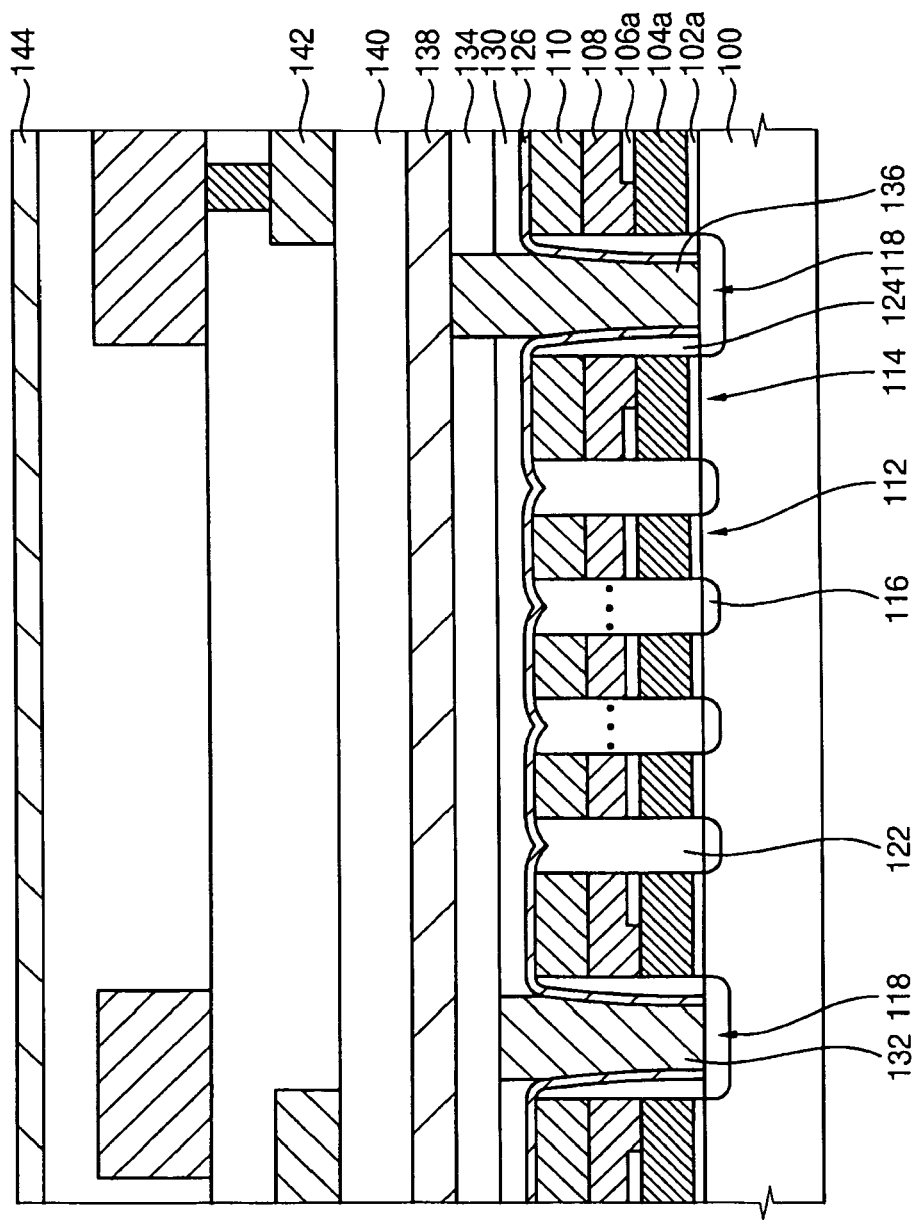
Figure 9:
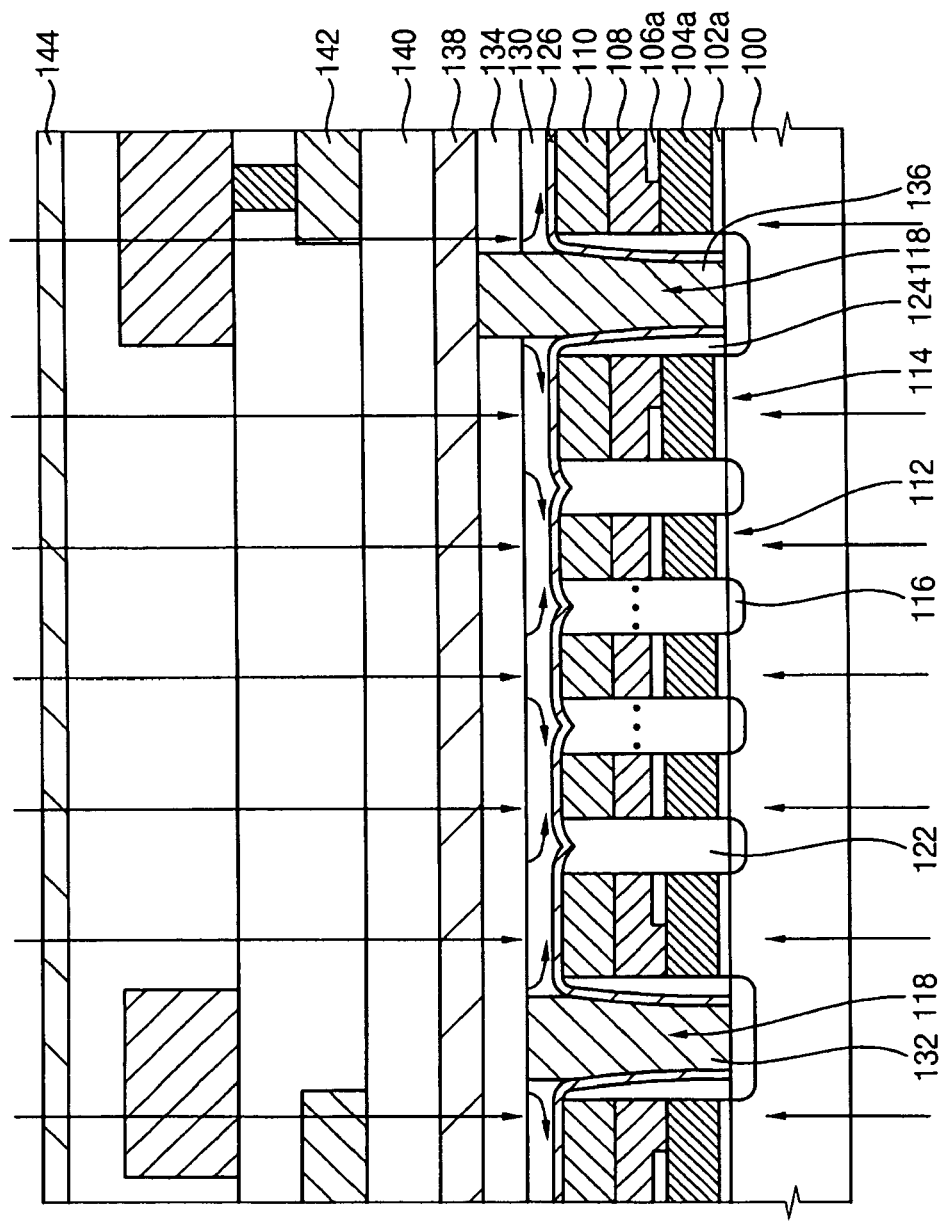

FIGS. 8 and 9 are cross-sectional views illustrating a method of manufacturing a non-volatile memory device in accordance with example embodiments. The method illustrated with reference to FIGS. 8 and 9 is substantially the same as or very similar to that illustrated with reference to FIGS. 1 to 7, except that a process for removing a lower portion of the substrate is added. Thus, detailed explanations on the same or similar processes are omitted.

First, structures shown in FIGS. 1 to 6 may be formed on the substrate 100. Referring to FIG. 8, a lower portion of the substrate 100 may be removed. The removing process may include a dry etch process or a lapping process. The lower portion of the substrate 100 may be removed such that the substrate 100 may have a reduced or predetermined or desired thickness to the level required in a successive packaging process. In example embodiments, a lapping process in the packaging process may be omitted.

Referring to FIG. 9, an annealing gas may be provided to both of the upper and lower faces of the substrate 100 to cure the defects of the tunnel insulation layer pattern 102a. The process for providing annealing gas may be substantially the same as or similar to that illustrated with reference to FIG. 7. However, the substrate 100 in FIG. 9 may have the reduced or predetermined or desired thickness so that the path of the annealing gas from the lower face of the substrate 100 to the tunnel insulation layer pattern 102a may become shorter. Thus, the annealing gas may reach the tunnel insulation layer pattern 102a relatively easily through the substrate 100. As a result, the curing effect of the annealing gas may be improved.

According to example embodiments, an annealing gas may be sufficiently provided into a tunnel insulation layer pattern even without removing a silicon nitride layer serving as an etch stop layer. Thus, the tunnel insulation layer pattern may have improved electrical characteristics, and a non-volatile memory device including the tunnel insulation layer pattern may have improved reliability, endurance, and/or data retention. Additionally, the method of manufacturing the non-volatile memory device in accordance with example embodiments may be applied not only to a floating gate type flash memory device but also to a charge trapping type flash memory device that may use a high-k metal oxide, silicon nitride or a nanocrystalline material for a charge storing layer. Furthermore, the method may be applied to a volatile memory device including a gate insulation layer.

While example embodiments have been particularly shown and described with reference to example embodiments thereof, it will be understood by those of ordinary skill in the art that various changes in form and details may be made therein without departing from the spirit and scope of the following claims.

What is claimed is:

1. A method of manufacturing a non-volatile memory device, comprising:
    forming at least one gate structure on an upper face of a substrate, the at least one gate structure including a tunnel insulation layer pattern, a charge storing layer pattern, a dielectric layer pattern and a control gate;
    forming a silicon nitride layer on the upper face of the substrate to cover the at least one gate structure;
    forming an insulating interlayer on the silicon nitride layer on the upper face of the substrate;
    exposing a lower face of the substrate; and
    curing defects in the tunnel insulation layer pattern by providing an annealing gas to the upper face of the substrate and the lower face of the substrate, wherein the curing of the defects in the tunnel insulation layer pattern is performed by providing the annealing gas directly to the upper face of the substrate and directly to the lower face of the substrate, and
    wherein exposing the lower face of the substrate includes removing remaining layers on the lower face of the substrate, the remaining layers including a silicon nitride layer formed on the lower face of the substrate while forming the silicon nitride layer on the at least one gate structure on the upper face of the substrate.

2. The method of claim 1, wherein exposing of the lower face of the substrate includes removing the remaining layers on the lower face of the substrate by a dry etch process or a cleaning process.

3. The method of claim 1, wherein forming the silicon nitride layer includes using a low pressure chemical vapor deposition (LPCVD) process.

4. The method of claim 1, wherein the annealing gas comprises at least one selected from the group consisting of hydrogen gas, heavy hydrogen gas, and tritium gas.

5. The method of claim 1, wherein providing the annealing gas is performed at a temperature of about 300 to about 500° C. for about 30 to about 90 minutes.

6. The method of claim 1, wherein providing the annealing gas is performed under a pressure of about 1 to about 30 atm.

7. The method of claim 1, wherein forming the at least one gate structure includes forming a plurality of first gate structures and a plurality of second gate structures, the first gate structures formed to constitute a group and the second gate structures formed at both sides of the group.

8. The method of claim 7, further comprising:
    forming an insulation layer pattern and spacers, the insulation layer pattern formed to fill spaces between the first gate structures, and the spacers are formed on sidewalls of the second gate structures, wherein the insulation layer pattern and spacers are formed before the silicon nitride layer is formed on the upper face of the substrate.

9. The method of claim 7, further comprising:
partially removing the insulating interlayer to expose a portion of the silicon nitride layer between the second gate structures;
removing the exposed portion of the silicon nitride layer to form a contact hole partially exposing the upper face of the substrate; and
forming a contact in the contact hole, wherein the contact hole is formed before providing the annealing gas.

10. The method of claim 7, further comprising:
partially removing the insulating interlayer to expose a portion of the silicon nitride layer between the second gate structures;
removing the exposed portion of the silicon nitride layer to form a trench partially exposing the upper face of the substrate; and
filling the trench with a conductive material to form a common source line, wherein the common source line is formed before providing the annealing gas.

11. The method of claim 1, further comprising:
forming metal wirings and other insulating interlayers on the insulating interlayer; and
forming a passivation layer on an uppermost layer in the non-volatile memory device.

12. The method of claim 1, wherein forming the at least one gate structure on an upper face of a substrate includes
forming a tunnel insulation layer on the upper face of the substrate,
forming a preliminary charge storing layer pattern on the tunnel insulation layer,
forming a dielectric layer on tunnel insulation layer,
removing a portion of the dielectric layer to render the dielectric layer island shaped,
forming a conductive layer on the dielectric layer and the preliminary charge storing layer pattern,
forming at least one hard mask on the conductive layer, and
partially etching the conductive layer, the dielectric layer, the preliminary charge storing layer pattern, and the tunnel insulation layer using the hard mask as an etching mask.

13. The method of claim 1, further comprising:
implanting impurities in the substrate to form at least one impurity region, the impurity region formed to a side of the at least one gate structure, wherein the impurities are implanted before the silicon nitride layer is formed on the upper face of the substrate.

14. The method of claim 1, wherein forming the insulating interlayer includes a chemical vapor deposition process.

15. The method of claim 14, wherein the chemical vapor deposition process uses borophosphosilicate glass to form the insulating interlayer.

16. A method of manufacturing a non-volatile memory device, comprising:
forming at least one gate structure on an upper face of a substrate, the at least one gate structure including a tunnel insulation layer pattern, a charge storing layer pattern, a dielectric layer pattern and a control gate;
forming a silicon nitride layer on the upper face of the substrate to cover the at least one gate structure;
forming an insulating interlayer on the silicon nitride layer on the upper face of the substrate;
removing a lower portion of the substrate to reduce the substrate thickness; and
curing defects in the tunnel insulation layer pattern by providing an annealing gas to the upper face of the substrate and a lower face of the substrate, wherein the curing of the defects in the tunnel insulation layer pattern is performed by providing the annealing gas directly to the upper face of the substrate and directly to the lower face of the substrate.

17. The method of claim 16, wherein removing the lower portion of the substrate is performed by an etching process or a lapping process.

* * * * *